(12) United States Patent
Beak et al.

(10) Patent No.: US 8,573,993 B2
(45) Date of Patent: Nov. 5, 2013

(54) CONNECTOR

(75) Inventors: SeungSeok Beak, Tokyo (JP); Koichi Kiryu, Nagano (JP); Takashi Yuba, Tokyo (JP); Daiei Iwamoto, Tokyo (JP); Akio Nakamura, Tokyo (JP)

(73) Assignee: Fujitsu Component Limited, Tokyo (JP)

( * ) Notice: Subject to any disclaimer, the term of this patent is extended or adjusted under 35 U.S.C. 154(b) by 0 days.

(21) Appl. No.: 13/557,426

(22) Filed: Jul. 25, 2012

(65) Prior Publication Data
US 2013/0040502 A1    Feb. 14, 2013

(30) Foreign Application Priority Data

Aug. 11, 2011    (JP) .................................. 2011-176408

(51) Int. Cl.
*H01R 29/00*    (2006.01)
(52) U.S. Cl.
USPC ....................................... 439/188; 200/51.09
(58) Field of Classification Search
USPC ....................................... 439/188; 200/51.09
See application file for complete search history.

(56) References Cited

U.S. PATENT DOCUMENTS

| 4,874,333 A * | 10/1989 | Reed ............................. 439/188 |
| 7,896,672 B2 * | 3/2011 | Felisilda De La Cruz .... 439/188 |
| 8,123,539 B2 * | 2/2012 | Nakamura et al. ............ 439/188 |

FOREIGN PATENT DOCUMENTS

| JP | 05-082208 | 4/1993 |
| JP | 2003-031301 | 1/2003 |

* cited by examiner

*Primary Examiner* — Briggitte R Hammond
(74) *Attorney, Agent, or Firm* — IPUSA, PLLC

(57)    ABSTRACT

A connector includes a first connector and a second connector configured to engage with the first connector to establish electrical connection, wherein the first connector includes a first contact terminal, and the second connector includes: a second contact terminal configured to come in contact with the first contact terminal; a switch part connected to the second contact terminal and including a fixed part and a movable part; and a movable member capable of pushing the movable part toward the fixed part, wherein the movable member is pushed by the first connector when the first connector engages with the second connector, and the movable member pushes the movable part toward the fixed part to bring the movable part in contact with the fixed part.

9 Claims, 16 Drawing Sheets

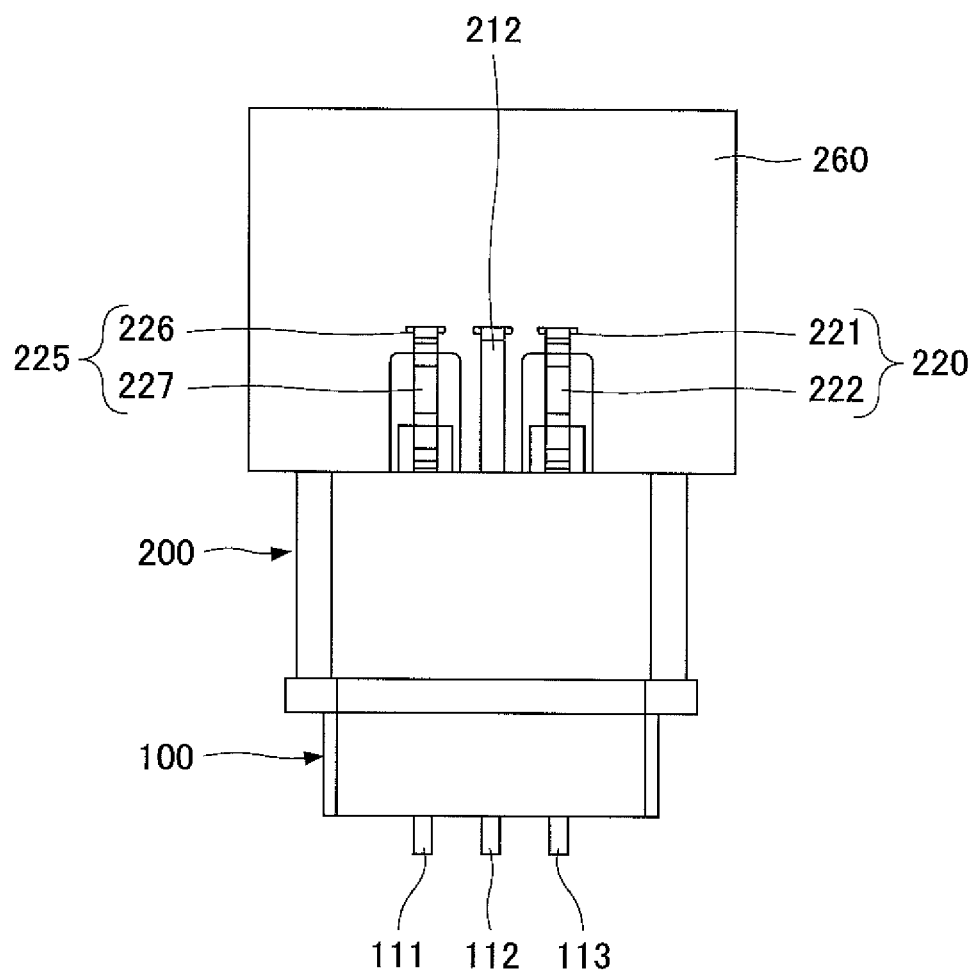

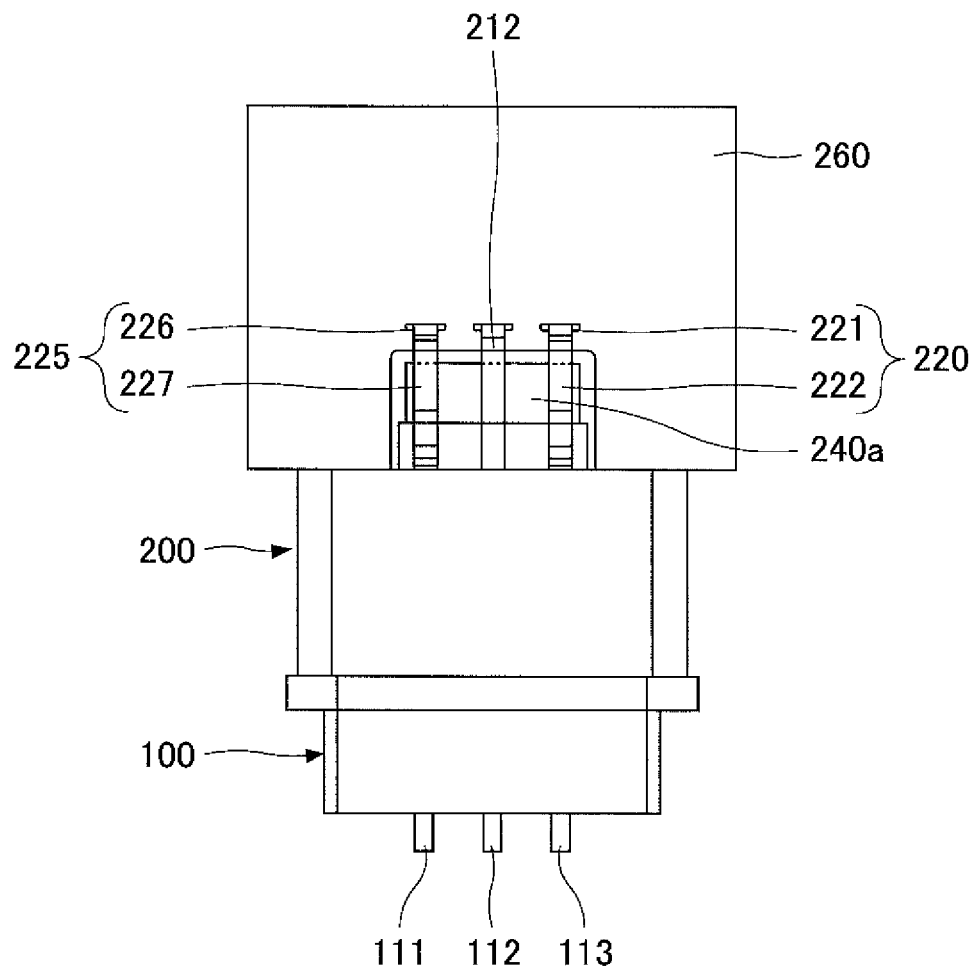

CONNECTOR

BACKGROUND OF THE INVENTION

1. Field of the Invention

The disclosures herein relate to a connector.

2. Description of the Related Art

Electrical equipment generally operates with electric power supplied from a power supply.

For the purpose of supplying electric power, connectors are typically used to supply electric power from the power supply to the electric equipment. Such connectors include a male-type connector having one or more male pins and a female-type connector having one or more female sockets, which mate with each other to establish electrical connection, as disclosed in Patent Documents 1 and 2.

In recent years, the supply of a direct-current high-voltage electric power has been under study for local-area electric power transmission as a measure against global warming. With such a power supply arrangement, power loss is small at the time of voltage conversion and electric power transmission, and, also, there is no need to use thick cables. Especially for information devices such as servers, such a power supply arrangement is believed to be desirable due to their large consumption of electric power.

Concerning the electric power that is supplied to electric equipment, there may be a case in which high voltage affects a human body and the operation of electronic components. When high voltage electric power is used, for information devices such as servers, connectors used at the point of electrical connection may need to have a special design that is different from that of normal connectors used for commercial AC power supply because manual work is performed at the time of installment and maintenance of the devices.

In the case of a connector in which a switch is embedded, a conventional switch cannot be used when voltage supplied from a power supply is higher than 100 V, or is a direct-current high voltage. When power supplied from a power supply is a direct-current 400 V, for example, a conventional switch for alternate-current 100 V cannot guarantee sufficient safety and reliability, and, thus, there is a risk in the continuing use of such a switch.

Accordingly, it may be desirable to provide a connector that can safely supply high-voltage electric power.

[Patent Document 1] Japanese Patent Application Publication No. 5-82208

[Patent Document 2] Japanese Patent Application Publication No. 2003-31301

SUMMARY OF THE INVENTION

It is a general object of the present invention to provide a connector that substantially obviates one or more problems caused by the limitations and disadvantages of the related art.

A connector includes a first connector and a second connector configured to engage with the first connector to establish electrical connection, wherein the first connector includes a first contact terminal, and the second connector includes: a second contact terminal configured to come in contact with the first contact terminal; a switch part connected to the second contact terminal and including a fixed part and a movable part; and a movable member capable of pushing the movable part toward the fixed part, wherein the movable member is pushed by the first connector when the first connector engages with the second connector, and the movable member pushes the movable part toward the fixed part to bring the movable part in contact with the fixed part.

According to at least one embodiment, a connector for use with a direct-current power supply or a power supply having higher voltage than a conventional commercial power supply is provided, and can safely supply electric power.

BRIEF DESCRIPTION OF THE DRAWINGS

Other objects and further features of the present invention will be apparent from the following detailed description when read in conjunction with the accompanying drawings, in which:

FIG. 28 is a drawing illustrating a connector of a second embodiment; and

FIG. 29 is a drawing illustrating a variation of the connector of the second embodiment.

DESCRIPTION OF THE PREFERRED EMBODIMENTS

Figure 1:
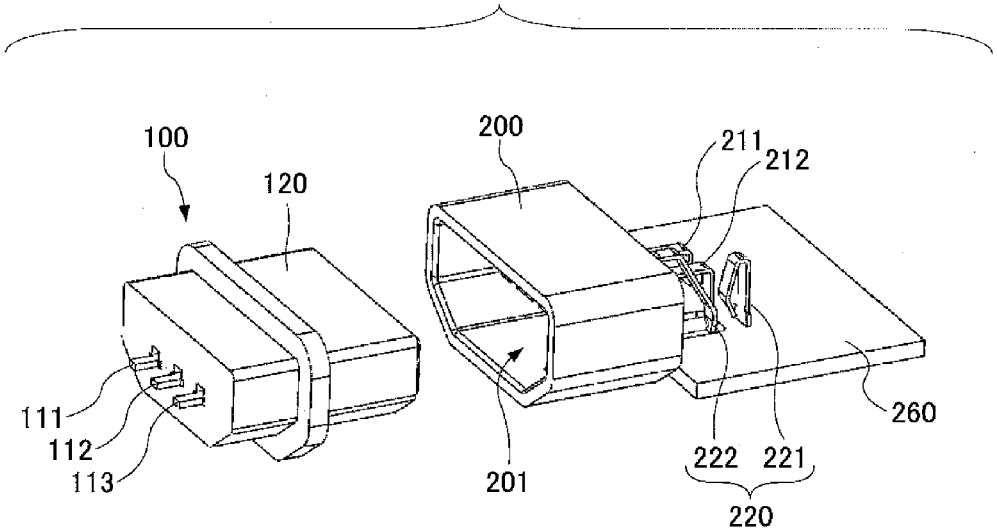
FIG. 1 is an oblique perspective view of a connector of a first embodiment.

In the following, embodiments will be described by referring to the accompanying drawings. The same elements throughout the drawings are referred to by the same numerals, and a description thereof will be omitted.

[First Embodiment]

<Configuration of Connector>

In the following, a description will be given of the structure of a connector according to a first embodiment. The connector of the present embodiment includes a plug connector 100 and a jack connector 200 illustrated in FIG. 1 through FIG. 3.

The plug connector 100 has a case part thereof formed of an insulating material, and has three plug-electrode terminals 111, 112, and 113 formed of an electrically conductive material such as metal. The plug-electrode terminals 111, 112, and 113 may be connected to a power-supply cable (not shown). The plug connector 100 has a plug connector coupling part 120 thereof, which is inserted into the interior space of the jack connector 200 for fitting connection. The plug-electrode terminals 111, 112, and 113 are formed to project from the opposite side of the plug connector 100 to the plug connector coupling part 120. In the description of the present embodiment, the plug-electrode terminal 111 may be connected to the plus of the power supply, the plug-electrode terminal 112 connected to the ground of the power supply, and the plug-electrode terminal 113 connected to the minus of the power supply, for example.

The jack connector 200 has a case part thereof formed of an insulating material, and has a recess 201 into which the plug connector coupling part 120 of the plug connector 100 is inserted. The jack connector 200 includes jack-electrode terminals 211 and 212 and a switch part 220. The jack-electrode terminals 211 and 212 and part of the switch part 220 are mounted on a printed board 260. The switch part 220 includes a movable part 222 and a fixed part 221. The fixed part 221 is connected to the printed board 260, and the movable part 222 is connected to the jack connector 200. When the jack connector 200 and the plug connector 100 are not engaged, the movable part 222 and the fixed part 221 are not in contact with each other, so that the switch part 220 is in an open state.

Figure 2:
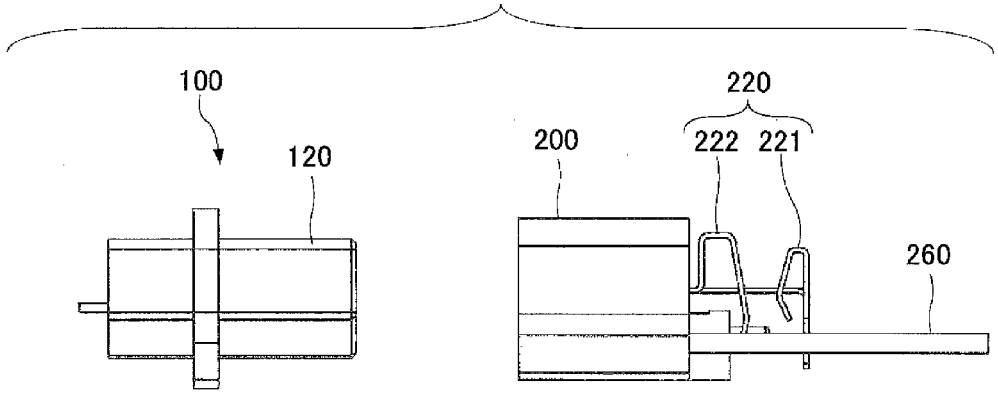
FIG. 2 is a lateral view of the connector of the first embodiment.
Figure 3:
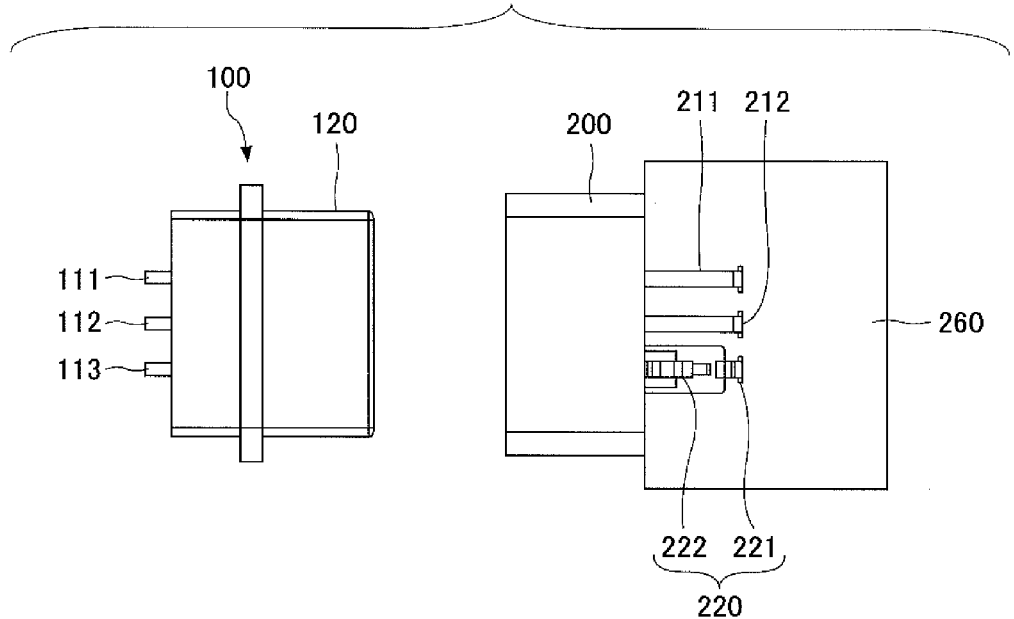
FIG. 3 is a top view of the connector of the first embodiment.
Figure 4:
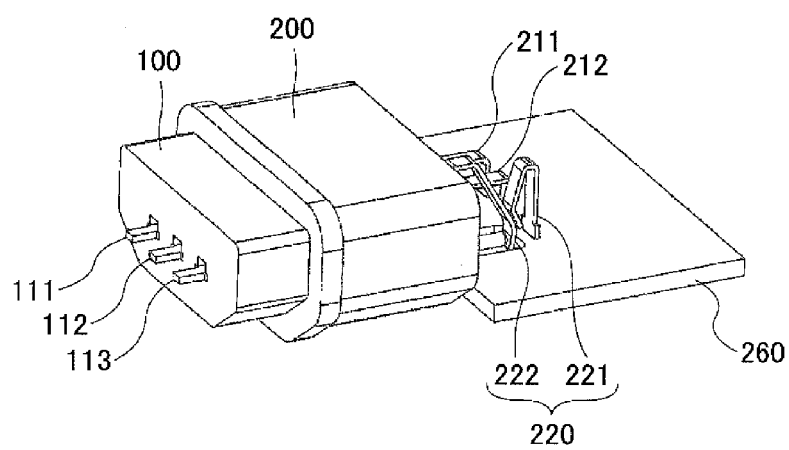
FIG. 4 is an oblique perspective view of the connector of the first embodiment in an engaged state.
Figure 5:
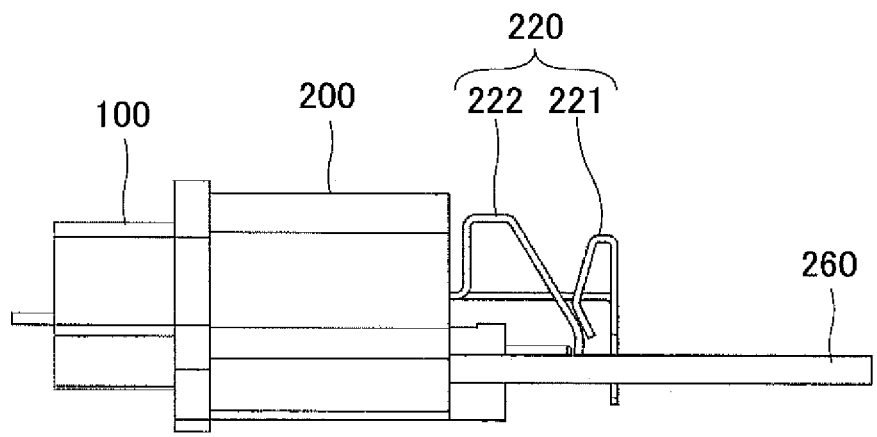
FIG. 5 is an lateral view of the connector of the first embodiment in an engaged state.

In the connector of the present embodiment, as illustrated in FIG. 4 and FIG. 5, the plug connector coupling part 120 of the plug connector 100 is inserted into the recess 201 of the jack connector 200 to engage therein for electrical connection, as was previously described. When this happens, the movable part 222 of the switch part 220 comes in contact with the fixed part 221 to establish electrical connection therewith, thereby resulting in a switch-closed state. FIG. 1 is an oblique perspective view of the connector of the present embodiment when the plug connector and the jack connector are not engaged with each other, and FIG. 2 and FIG. 3 are a lateral view and a top view thereof, respectively. FIG. 4 is an oblique perspective view of the connector of the present embodiment when the plug connector and the jack connector are engaged with each other, and FIG. 5 is a lateral view thereof.

<Plug Connector>

Figure 10:
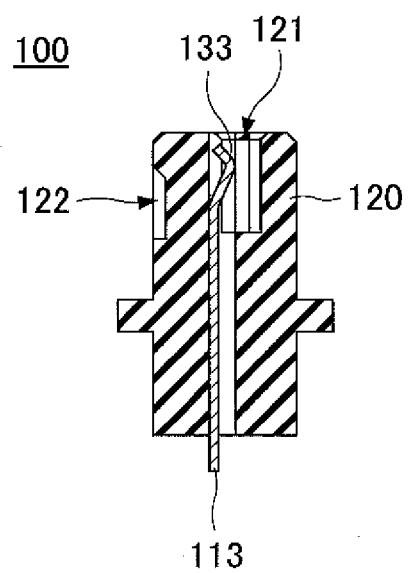
FIG. 10 is a cross-sectional view of the plug connector of the first embodiment.
Figure 11:
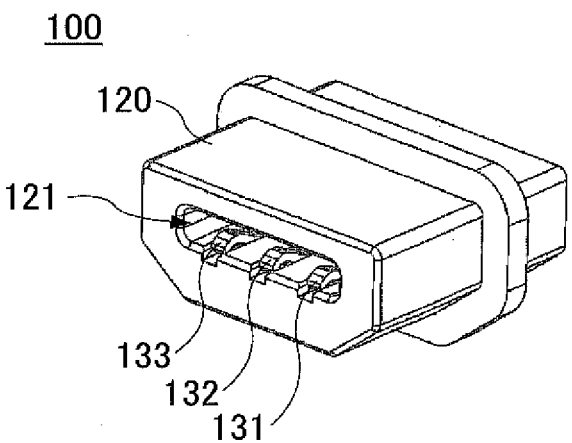
FIG. 11 is an oblique perspective view of the plug connector of the first embodiment.
Figure 12:
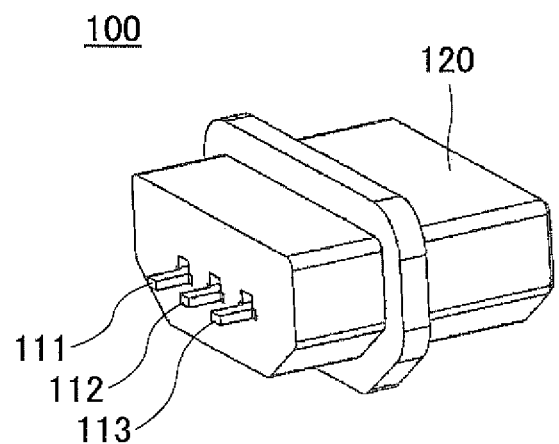
FIG. 12 is an oblique perspective view of the plug connector of the first embodiment.
Figure 13:
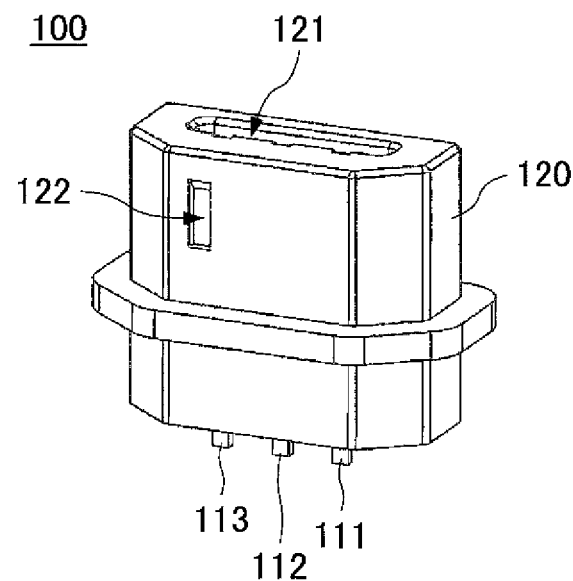
FIG. 13 is an oblique perspective view of the plug connector of the first embodiment.

In the following, a description will be given of the plug connector 100 of the present embodiment by referring to FIG. 6 through FIG. 13. As was previously described, the plug connector 100 of the present embodiment includes therein the three plug-electrode terminals 111, 112, and 113 formed of an electrically conductive material such as metal. As illustrated in FIG. 10, FIG. 11, and FIG. 13, an opening 121 is formed inside the plug connector coupling part 120 that is to be coupled to the jack connector 200, and the opening 121 has plug-contact terminals 131, 132, and 133 provided therein. Inside the plug connector 100, the plug-contact terminals 131, 132, and 133 are connected to the plug-electrode terminals 111, 112, and 113, respectively, as illustrated in FIG. 10 in a representative manner. Namely, the plug-electrode terminal 111 is connected to the plug-contact terminal 131, the plug-electrode terminal 112 to the plug-contact terminal 132, and the plug-electrode terminal 113 to the plug-contact terminal 133.

Figure 6:
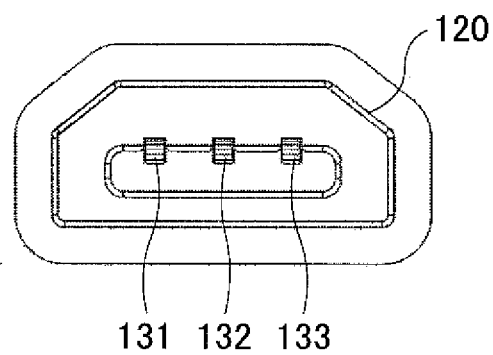
FIG. 6 is a front view of a plug connector of the first embodiment.
Figure 7:
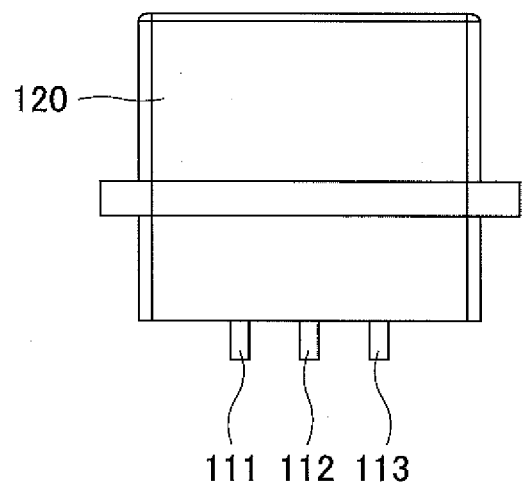
FIG. 7 is a top view of the plug connector of the first embodiment.
Figure 8:
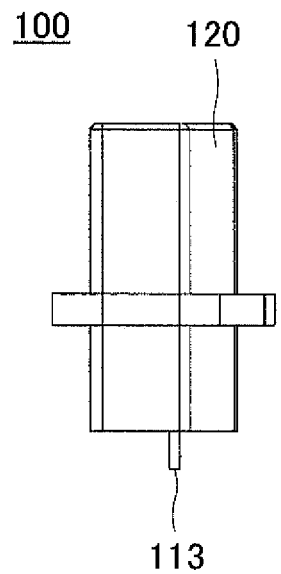
FIG. 8 is a lateral view of the plug connector of the first embodiment.
Figure 9:
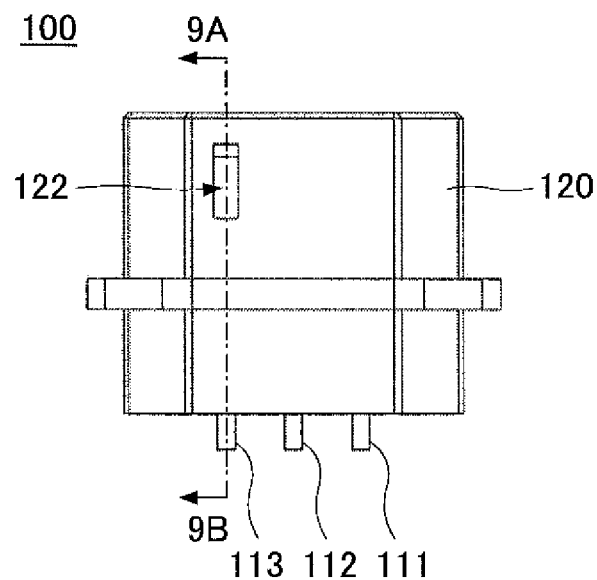
FIG. 9 is a bottom view of the plug connector of the first embodiment.

As illustrated in FIG. 9 and FIG. 13, an indentation 122 is formed in the surface of the plug connector coupling part 120 of the plug connector 100 for the purpose of avoiding easy decoupling of the plug connector coupling part 120 from the jack connector 200. FIG. 6 is a front view of the plug connector. FIG. 7 is a top view of the plug connector. FIG. 8 is a lateral view of the plug connector. FIG. 9 is a bottom view of the plug connector. FIG. 10 is a cross-sectional view taken along the line 9A-9B illustrated in FIG. 9. FIG. 11 is an oblique perspective view of the plug connector from the front. FIG. 12 is an oblique perspective view of the plug connector from the back. FIG. 13 is an oblique perspective view of the plug connector from the lower surface side.

<Jack Connector>

In the following, a description will be given of the jack connector 200 of the present embodiment by referring to FIG. 14 through FIG. 20. The jack connector 200 of the present embodiment includes a case part 230 formed of an insulating material, and the recess 201 is provided into which the plug connector coupling part 120 of the plug connector 100 is inserted. The jack-electrode terminals 211 and 212 and the switch part 220 are situated at their respective positions on the case part 230. As can be understood from FIG. 16, the jack-electrode terminal 211 includes a jack-contact terminal 211a extending inside the recess 201 of the case part 230 and a jack-connection terminal 211b connected to the printed board 260. By the same token, the jack-electrode terminal 212 includes a jack-contact terminal 212a extending inside the recess 201 of the case part 230 and a jack-connection terminal 212b connected to the printed board 260.

As was previously described, the switch part 220 includes the fixed part 221 and the movable part 222. The fixed part 221 includes a spring part 221a inclusive of a contact part coming in contact with the movable part 222, and also includes a fixed-connection part 221b connected to the printed board 260. The movable part 222 includes a jack-contact terminal 222a extending inside the recess 201 of the case part 230, a contact part 222b coming in contact with the fixed part 221, and a spring part 222c.

Figure 16:
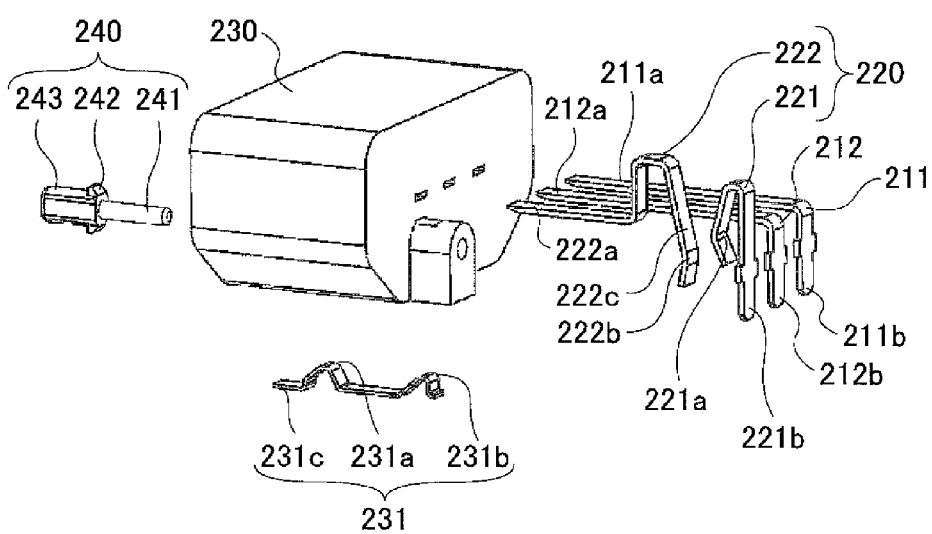
FIG. 16 is an exploded view of the jack connector of the first embodiment.
Figure 17:
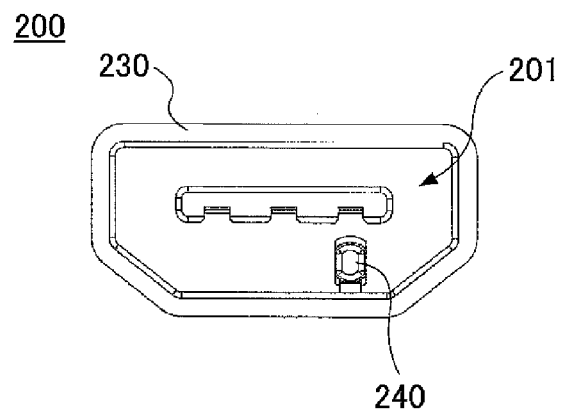
FIG. 17 is a front view of the jack connector of the first embodiment.

Further, as illustrated in FIG. 16 and FIG. 17, a movable member 240 is provided on the case part 230 for the purpose of deforming the movable part 222. The movable member 240 includes a tip part 241 to push and deform the movable part 222 toward the fixed part 221. The movable member 240 further includes a click 242 for fixing the movable part 222 at such a position that an electrical connection is established between the fixed part 221 and the movable part 222 when the plug connector 100 is engaged in the jack connector 200. The movable member 240 further includes, at the end facing the plug connector 100, a contact part 243 coming in contact with the plug connector 100.

The jack connector 200 of the present embodiment is also provided with a hook 231. The hook 231 is made of a material having spring property such as metal, and includes two arch parts 231a and 231b. The arch part 231a serves to maintain the engaged state of the jack connector 200 and the plug connector 100. The arch part 231b serves to maintain the position of the movable member 240 when the movable part 222 is in contact with the fixed part 221. In the present embodiment, an end 231c of the hook 231 pointing to the direction of the plug connector 100 is fixedly mounted in the case part 230. The hook 231 is deformable while the end 231c is fixedly mounted.

Figure 14:
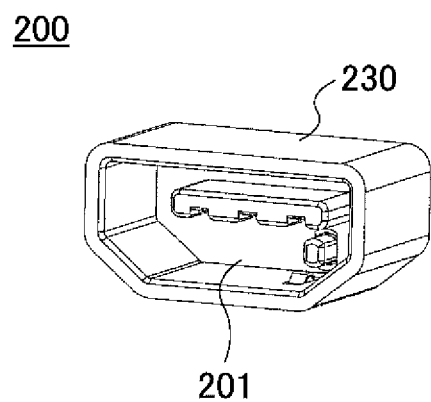
FIG. 14 is an oblique perspective view of a jack connector of the first embodiment.
Figure 15:
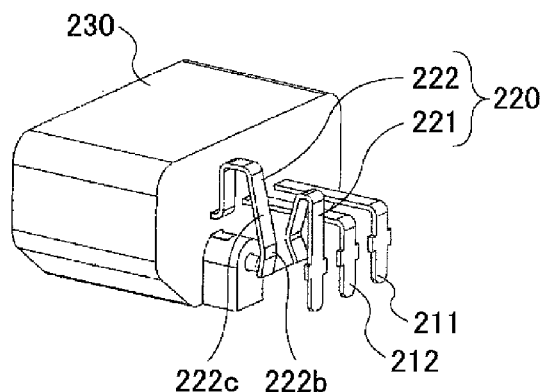
FIG. 15 is an oblique perspective view of the jack connector of the first embodiment.
Figure 18:
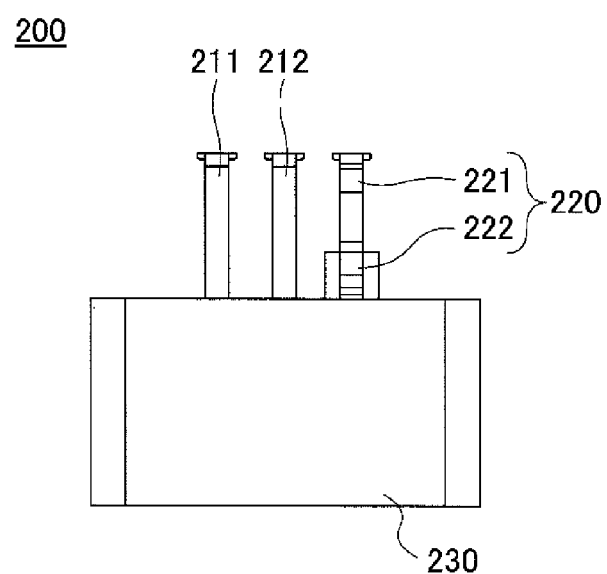
FIG. 18 is a top view of the jack connector of the first embodiment.
Figure 19:
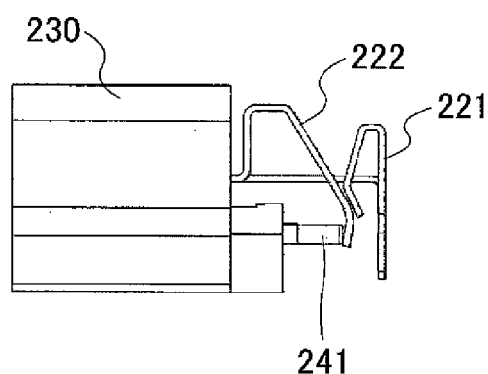
FIG. 19 is a lateral view of the jack connector of the first embodiment.
Figure 20:
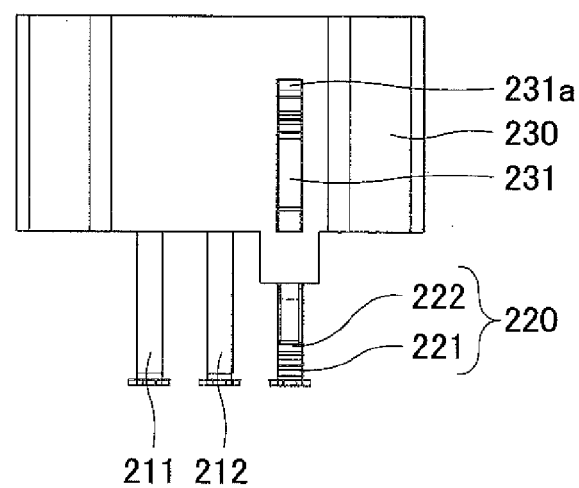
FIG. 20 is a bottom view of the jack connector of the first embodiment.

In the present embodiment, the end 231c of the hook 231 is situated on the side where the arch part 231a is provided. Namely, the hook 231 is formed such that the end 231c, the arch part 231a, and the arch part 231b are arranged in this order. FIG. 14 is an oblique perspective view of the jack connector from the front. FIG. 15 is an oblique perspective view of the jack connector from the back. FIG. 16 is an exploded view of the jack connector. FIG. 17 is a front view of the jack connector. FIG. 18 is a top view of the jack connector in the state in which the fixed part 221 and the movable part 222 are in contact with each other. FIG. 19 is a lateral view of the jack connector in the state in which the fixed part 221 and the movable part 222 are in contact with each other. FIG. 20 is a bottom view of the jack connector.

<Signal Processing>

In the following, a method of coupling connectors according to the present embodiment, namely a method of connecting the plug connector 100 and the jack connector 200 according to the present embodiment, will be described.

Figure 21:
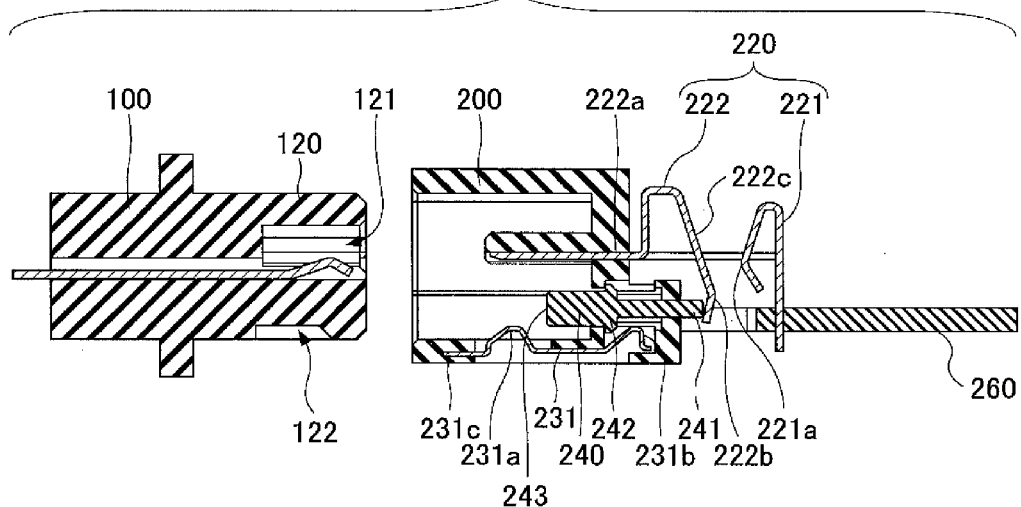
FIG. 21 is a drawing illustrating a method of engaging connectors of the first embodiment.

As illustrated in FIG. 21, the fixed part 221 and the movable part 222 of the switch part 220 are not in contact with each other when the plug connector 100 and the jack connector 200 are not engaged with each other.

Figure 22:
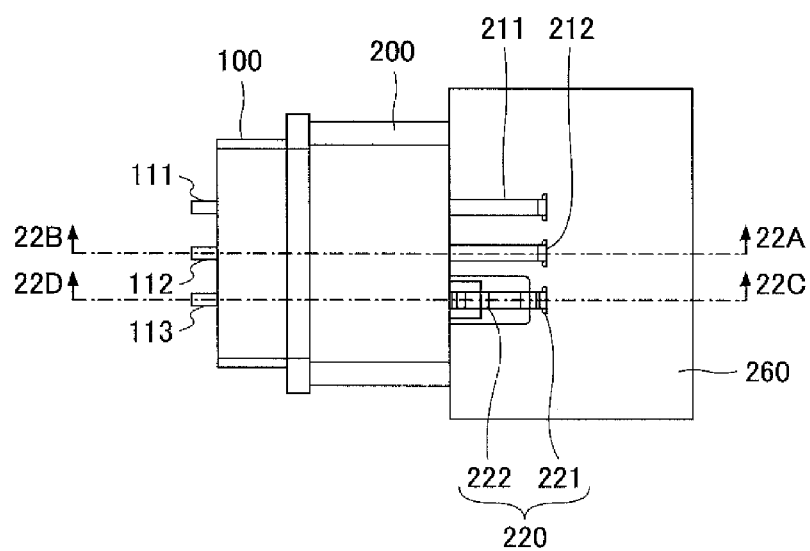
FIG. 22 is a drawing illustrating the method of engaging connectors of the first embodiment.
Figure 23:
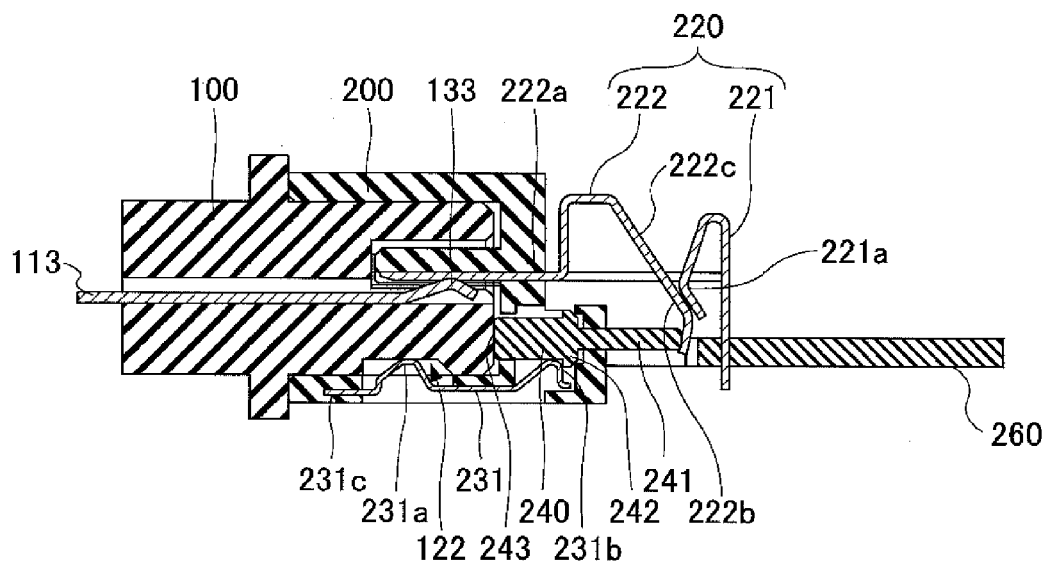
FIG. 23 is a drawing illustrating the method of engaging connectors of the first embodiment.

The plug connector 100 engages with the jack connector 200 as illustrated in FIG. 22 and FIG. 23. When this happens, the anterior part of the plug connector coupling part 120 of the plug connector 100 comes in contact with the contact part 243 of the movable member 240, thereby pushing the movable member 240 into a greater depth in the jack connector 200. With this movement, the tip part 241 of the movable member 240 pushes the movable part 222, so that the contact part 222b of the movable part 222 is brought in contact with a contact part of the spring part 221a. As a result, the movable part 222 is in contact with the fixed part 221 to establish electrical connection. When the plug connector 100 engages with the jack connector 200, the plug-contact terminal 131 of the plug connector 100 is in contact with the jack-contact terminal 211a of the jack-electrode terminal 211 of the jack connector 200 to provide electrical connection before the movable part 222 comes in contact with the fixed part 221. By the same token, the plug-contact terminal 132 of the plug connector 100 is in contact with the jack-contact terminal 212a of the jack-electrode terminal 212 of the jack connector 200 to provide electrical connection before the movable part 222 comes in contact with the fixed part 221. In this state, the plug-contact terminal 133 of the plug connector 100 is in contact with the jack-contact terminal 222a of the movable part 222 of the jack connector 200 but the movable part 222 is not yet in contact with the fixed part 221. As a result, the plug-contact terminal 133 of the plug connector 100 is not electrically connected to the fixed part 221 of the jack connector 200, so that no power is supplied.

Figure 24:
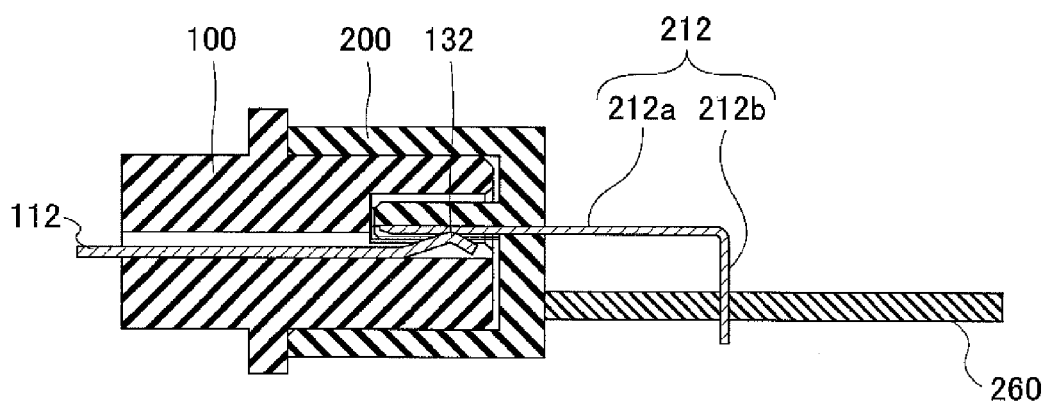
FIG. 24 is a drawing illustrating the method of engaging connectors of the first embodiment.

From the state noted above, the anterior part of the plug connector coupling part 120 of the plug connector 100 pushes the contact part 243 of the movable member 240, so that the tip part 241 of the movable member 240 pushes and deforms the movable part 222, thereby bringing the fixed part 221 in contact with the movable part 222. In this manner, the plug-contact terminal 133 of the plug connector 100 is electrically coupled to the fixed part 221 of the jack connector 200 to supply electrical power. FIG. 22 is a top view of this state. FIG. 23 is a cross-sectional view taken along the line 22A-22B illustrated in FIG. 22. FIG. 24 is a cross-sectional view taken along the line 22C-22D illustrated in FIG. 22.

Figure 25:
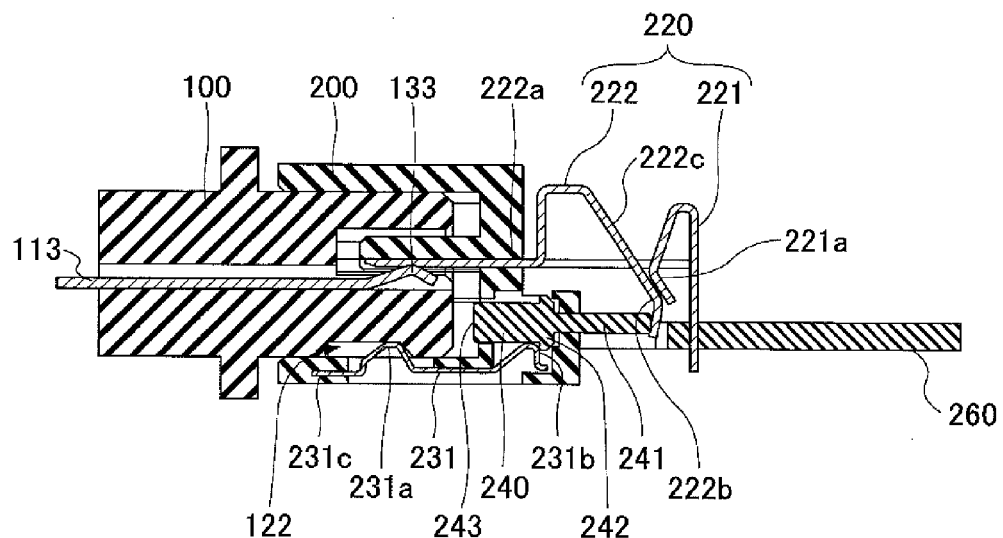
FIG. 25 is a drawing illustrating the method of engaging connectors of the first embodiment.
Figure 26:
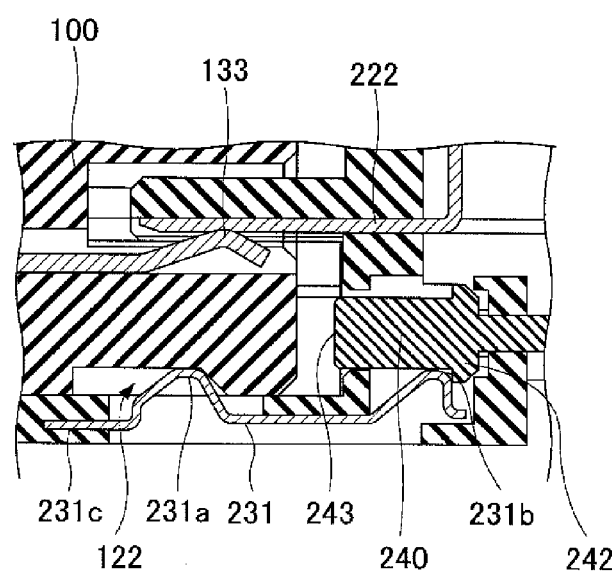
FIG. 26 is a drawing illustrating the method of engaging connectors of the first embodiment.

In this state, the arch part 231a of the hook 231 is inserted into the indentation 122 of the plug connector 100, and the click 242 of the movable member 240 is engaged with the arch part 231b of the hook 231. Consequently, the movable member 240 is kept at its current position, without being allowed to move toward the direction of plug connector 100. This ensures that the fixed part 221 and the movable part 222 of the switch part 220 be kept in contact with each other. Further, the plug connector 100 is kept within the range of positions defined by the loose fitting of the arch part 231a of the hook 231 in the indentation 122. Namely, even in the state in which the plug connector 100 is detached from the jack connector 200, the movable part 222 of the switch part 220 is kept in contact with the fixed part 221. FIG. 25 is a cross-sectional view taken along the same line as the cross-sectional view illustrated in FIG. 23, illustrating the state in which the plug connector 100 is slightly detached from the jack connector 200. FIG. 26 is an enlarged view of a relevant part of the cross-section illustrated in FIG. 25.

When the plug connector 100 is further detached from the jack connector 200, the arch part 231a of the hook 231 is released from the indentation 122 of the plug connector 100, and the plug connector 100 pushes the arch part 231a of the hook 231 outwardly. Because of this, the hook 231 fixed at the end 231c thereof is bent, thereby releasing the click 242 of the movable member 240 that has been engaged with the arch part 231b of the hook 231, resulting in the movable member 240 being shifted toward the plug connector 100 due to the restoring force of the spring part 222c, which is a portion of the movable part 222 of the switch part 220. Consequently, the movable part 222 is detached from the fixed part 221, so that the switch part 220 is placed in an open state to disconnect electric power supply.

In the connector of the present embodiment, the control of an on-or-off state of power supply is not performed between the plug-contact terminal 133 of the plug connector 100 and the jack-contact terminal 222a of the jack connector 200, but is performed between the movable part 222 and the fixed part 221 of the switch part 220. With this arrangement, no arc discharge occurs between the plug-contact terminal 133 of the plug connector 100 and the jack-contact terminal 222a of the jack connector 200, thereby increasing the lifetime and reliability of the connector. Since the strong restoring force of the spring part 222c is exerted at the time the movable part 222 is detached from the fixed part 221, high-speed detachment is ensured. Even if arc discharge occurs between these parts, therefore, the duration of arc is extremely short. Damage caused by arc occurring between the fixed part 221 and the movable part 222 would thus be extremely small.

Figure 27:
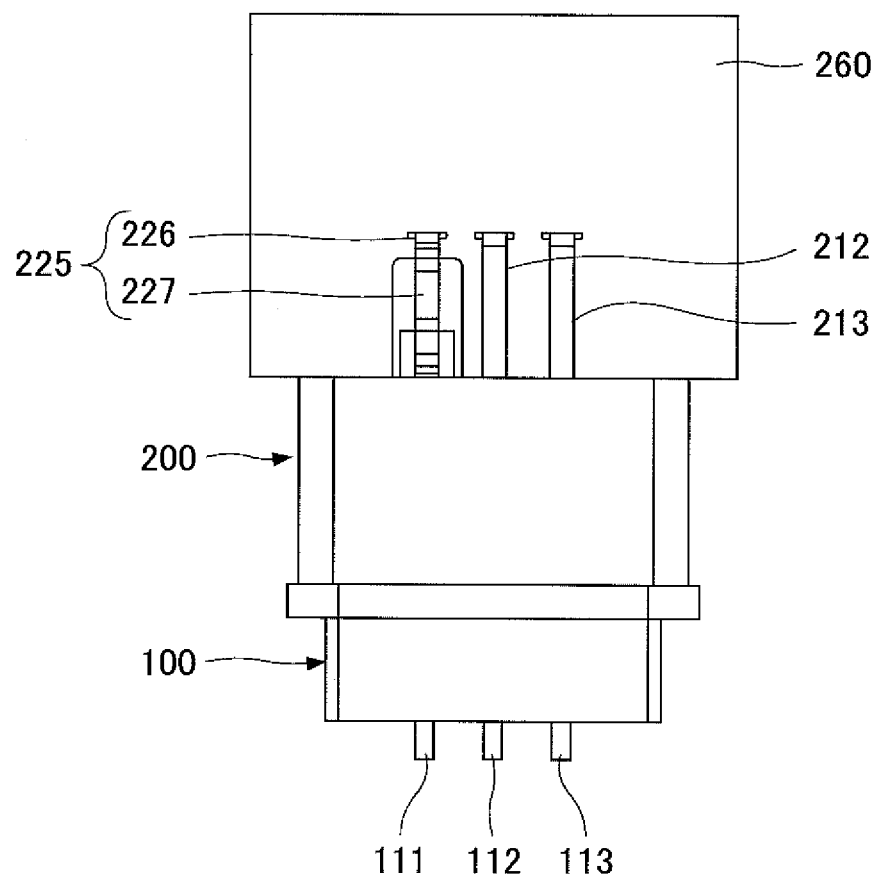
FIG. 27 is a drawing illustrating a variation of the connector of the first embodiment.

The above embodiment has been described with respect to an example in which the switch part 220 is provided for connection with the plug-electrode terminal 113. Alternatively, as illustrated in FIG. 27, a switch part 225 having a movable part 227 and a fixed part 226 similar to the switch part 220 may be provided for connection with plug-electrode terminal 111.

[Second Embodiment]

In the following, a second embodiment will be described. In this embodiment, as illustrated in FIG. 28, the switch part 220 having the fixed part 221 and the movable part 222 is provided for connection with the plug-electrode terminal 113, and, also, the switch part 222 having the fixed part 226 and the movable part 227 is provided for connection with plug-electrode terminal 111. With this arrangement, the control of on-or-off state of power supply can be performed substantially simultaneously between the plus side and the minus side.

In this case, as illustrated in FIG. 29, a single movable member 240a that can push the movable part 222 of the switch part 220 and the movable part 227 of the switch part 225 at the same time may be employed. This arrangement reduces the number of components, thereby achieving cost reduction.

Configurations other than those described above are the same as or similar to those of the first embodiment.

Further, although the present invention is not limited to these embodiments, but various variations and modifications may be made without departing from the scope of the present invention.

The present application is based on Japanese priority application No. 2011-176408 filed on Aug. 11, 2011, with the Japanese Patent Office, the entire contents of which are hereby incorporated by reference.

What is claimed is:

1. A connector, comprising:
    a first connector; and
    a second connector configured to engage with the first connector to establish electrical connection,
    wherein the first connector includes a first contact terminal, and
    the second connector includes:
        a second contact terminal configured to come in contact with the first contact terminal;
        a switch part connected to the second contact terminal and including a fixed part and a movable part; and
        a movable member capable of pushing the movable part toward the fixed part,
    wherein the movable member is pushed by the first connector when the first connector engages with the second connector, and the movable member pushes the movable part toward the fixed part to bring the movable part in contact with the fixed part.

2. The connector as claimed in claim 1, wherein the first connector is a plug connector, and the second connector is a jack connector.

3. The connector as claimed in claim 1, wherein the first connector includes a plurality of first contact terminals identical to each other, one of which is the noted first contact terminal, and the second connector includes a plurality of second contact terminals identical to each other, one of which is the noted second contact terminal, the plurality of second contact terminals being provided in one-to-one correspondence with the plurality of first contact terminals,
    and wherein the switch part is connected only to the noted second contact terminal.

4. The connector as claimed in claim 1, wherein the first connector includes a plurality of first contact terminals identical to each other, one of which is the noted first contact terminal, and the second connector includes a plurality of second contact terminals identical to each other, one of which is the noted second contact terminal, the plurality of second contact terminals being provided in one-to-one correspondence with the plurality of first contact terminals,
    and wherein the second connector includes a plurality of switch parts identical to each other, one of which is the noted switch part, and the switch parts are connected to the second contact terminals, respectively.

5. The connector as claimed in claim 1, wherein when the first connector engages with the second connector, the first contact terminal comes in contact with the second contact terminal before the movable part of the switch part comes in contact with the fixed part.

6. The connector as claimed in claim 1, wherein the second contact terminal and the movable part are connected to each other.

7. The connector as claimed in claim 1, wherein the second connector further includes a hook having two arch parts, the first connector further including an indentation corresponding to a first one of the arch parts, the movable member having a click corresponding to a second one of the arch parts,
    and wherein when the first connector and the second connector are engaged with each other, the first one of the arch parts is situated in the indentation, and the second one of the arch parts is engaged with the click of the movable member, thereby keeping the movable member at a fixed position.

8. The connector as claimed in claim 7, wherein a movement of the first one of the arch parts to disengage from the indentation causes the second one of the arch parts to disengage from the click.

9. The connector as claimed in claim 7, wherein the movable part includes a spring part,
    and wherein when the second one of the arch parts disengages from the click, a restoring force of the spring part pushes the movable member toward the first connector, thereby detaching the movable part from the fixed part.

* * * * *